US006842363B2

(12) United States Patent
Thewes et al.

(10) Patent No.: US 6,842,363 B2
(45) Date of Patent: Jan. 11, 2005

(54) MAGNETORESISTIVE MEMORY AND METHOD FOR READING A MAGNETORESISTIVE MEMORY

(75) Inventors: Roland Thewes, Groebenzell (DE); Werner Weber, München (DE); Hugo Van Den Berg, Diethorn (NL)

(73) Assignee: Infineon Technologies AG, Munich (DE)

( * ) Notice: Subject to any disclaimer, the term of this patent is extended or adjusted under 35 U.S.C. 154(b) by 23 days.

(21) Appl. No.: 10/455,154

(22) Filed: Jun. 5, 2003

(65) Prior Publication Data

US 2004/0213037 A1 Oct. 28, 2004

Related U.S. Application Data

(63) Continuation of application No. PCT/DE01/04400, filed on Nov. 22, 2001.

(30) Foreign Application Priority Data

Dec. 5, 2000 (DE) .......................................... 100 60 432

(51) Int. Cl.$^7$ .............................................. G11C 11/00
(52) U.S. Cl. ...................................... 365/158; 365/203
(58) Field of Search ................................. 365/158, 157, 365/203, 171

(56) References Cited

U.S. PATENT DOCUMENTS 5,936,882 A  *  8/1999  Dunn .......................... 365/158
6,021,065 A      2/2000  Daughton et al. ........... 365/158
6,128,228 A     10/2000  Pasotti et al. ............ 365/185.21
6,205,073 B1     3/2001  Naji ............................ 365/209
6,463,979 B1  * 10/2002  Sano et al. .................. 156/503
6,512,689 B1  *  1/2003  Naji et al. ................... 365/158
6,625,076 B2  *  9/2003  Weber et al. ................ 365/207
6,747,891 B2  *  6/2004  Hoffmann et al. .......... 365/158

FOREIGN PATENT DOCUMENTS

EP             0 595 266 A2      5/1994

* cited by examiner

Primary Examiner—Tan T. Nguyen
(74) Attorney, Agent, or Firm—Laurence A. Greenber; Werner H. Stemer; Ralph E. Locher (57) ABSTRACT

A magnetoresistive memory includes a control circuit with a first pole that, via a reading distributor, can be individually connected to first ends of bit lines by switching elements. The control circuit also has a second pole, which supplies power to an evaluator, and has a third pole that is connected to a reference voltage source. The readout circuit additionally includes a third voltage source having a voltage, which is approximately equal to the voltage of the first reading voltage source and which can be individually connected to second ends of the bit lines by means of switching elements. Finally, the readout circuit includes a fourth voltage source, which can be individually connected to second ends of the word lines by means of switching elements.

30 Claims, 2 Drawing Sheets

MAGNETORESISTIVE MEMORY AND METHOD FOR READING A MAGNETORESISTIVE MEMORY

CROSS-REFERENCE TO RELATED APPLICATION

This application is a continuation of copending International Application No. PCT/DE01/04400, filed Nov. 22, 2001, which designated the United States and was not published in English.

BACKGROUND OF THE INVENTION

Field of the Invention

The invention relates to a magnetoresistive memory and to a method for reading memory cells in a magnetoresistive memory such as this.

Magnetoresistive memories represent an alternative to conventional DRAM and SRAM memories as well as to non-volatile memories, for example flash or EEPROM. They include a configuration of memory cells to which bit lines and word lines are connected. Each individual memory cell in a magnetoresistive memory includes two magnetic elements that are isolated from one another by a dielectric. One of the magnetic elements is hard-magnetic and its magnetic flux direction is thus predetermined, while the other is soft-magnetic and its orientation can be reversed by applying suitable switching currents to the bit lines and word lines.

The dielectric that is disposed between the two magnetic elements is a so-called tunnel dielectric, for example a layer that is suitable for use as a tunnel dielectric and that has a thickness of 2 nm. The tunnel dielectric has, as a special feature, an electrical resistance that is dependent on the magnetic field that surrounds it. If both magnetic elements on both sides of the tunnel dielectric are oriented in the same direction, the dielectric has a different resistance value to that when the magnetic flux directions of the two magnetic elements are inverted with respect to one another.

The respective present value of the resistance in the tunnel dielectric can be determined by applying a suitable voltage to the bit lines and to the word lines, thus making it possible to deduce the orientation of the magnetic elements. Overall, this therefore results in a state system that operates in a binary manner and is thus suitable for storing digital information. In addition to the resistance that is inherent from the function, one specific type of magnetoresistive memory cells includes a diode function.

In a configuration of memory cells such as this, it is possible, for example, to provide bit lines and word lines that in each case run parallel above and below the actual memory cells, and that are in turn configured at right angles to one another. The bit lines and word lines can then be connected at the edge of the memory cell configuration to additional circuits for writing and reading.

Arrays of MRAM bulk memories have not yet so far appeared as products. Only relatively small configurations (arrays) are available, which are generally based on the "current in-plane" principle, while the "current perpendicular to plane" principle has better prospects for bulk memory applications. Magnetoresistive memories offer certain fundamental advantages, such as simple manufacture, nonvolatile data storage and good shrink suitability. Their suitability for use as bulk memories depends to a major extent on whether sufficiently large memory cell blocks can be produced. Configurations (arrays) of competitive bulk memories must satisfy the following requirements at the same time:

The array must allow a size of (several hundred)×(several hundred) memory cells.

The read signal must have a specific minimum magnitude in order to allow sufficiently reliable assessment.

Examples of Semiconductor Memories:

DRAMs require approximately 100–150 mV. They carry out a voltage assessment at the array edge by using read amplifiers that are seated in the pitch.

Flash memories (embedded) require approximately 10 $\mu$A. They carry out a current assessment using read amplifiers in the peripheral area.

SRAMs operate with on currents of about 150 $\mu$A and negligible off currents. They achieve array access times of 600 ps–1.2 ns.

Precise values cannot be stated a priori for MRAM, and it is necessary to check on a case-by-case basis whether the read signal is sufficient for reliable assessment that is sensitive to interference.

The energy consumption for reading should be comparable to or less than that for DRAM (depending on the architecture, 1 pJ–1 nJ). These requirements must also be placed on any bulk storage application for MRAMS.

SUMMARY OF THE INVENTION

It is accordingly an object of the invention to provide a magnetoresistive memory and a method for reading a magnetoresistive memory that overcome the hereinaforementioned disadvantages of the heretofore-known devices of this general type and that provide a suitable architecture for reliable writing, reading and deletion of magnetoresistive memory cells in configurations of such memory cells, that is to say magnetoresistive memories.

The present invention is based on the principle of applying fixed voltages to both poles of the memory cell that is to be read, independently of any current through the cell, which is done by connecting a fixed voltage source to one pole of the cell and by connecting a control circuit to the other pole of the cell. The control circuit keeps the potential at this pole constant independently of the cell current. The current is thus dependent on the cell state, which can now be determined by measuring the current or some variable that is dependent on it.

The invention is thus primarily based on a magnetoresistive memory having a configuration of magnetoresistive memory cells that are configured in two or more rows and/or two or more columns, with a resistor and a diode function; a bit line for each of the columns, which is connected to first poles of the memory cells that belong to that column; a word line for each of the rows, which is connected to second poles of the memory cells that belong to that row; and a first read voltage source having a first voltage, which can be connected individually to first ends of the word lines by using switching elements.

The memory according to the invention is characterized by a control circuit, having a first pole that can be connected individually via a read distributor by using switching elements to first ends of the bit lines; a second pole, from which current can be or is fed into an assessment device; and a third pole that is connected to a reference voltage source; a third voltage source having a voltage which is approximately the same as the voltage from the first read voltage source and that can be connected individually via switching elements to second ends of the bit lines; and a fourth voltage source that can be connected individually via switching elements to second ends of the word lines. The invention is furthermore characterized in that the voltage of the reference voltage source and the control circuit is constructed such that a voltage is present at the first pole that corresponds approximately to the voltage from the fourth voltage source; and the current flowing through the second pole of the control circuit is approximately the same as the current flowing through the first pole of the control circuit, and this current is independent of the voltage that is present at the second pole of the control circuit.

The phrases "essentially the same" and "essentially equaling" for the purposes of the present invention mean that the current at the two poles differs at most to an extent such that the measurement of the current by the assessment device makes it possible to draw a reliable conclusion about the state of the cell (assuming that this can be achieved by using one or more measurements). The two or more memory cells that are organized in a configuration have rows and columns.

Because, in order to carry out the method according to the invention, voltages are applied to those word and bit lines which are not connected to the memory cell which is to be read, it follows that more than one line must be provided in at least one of the two stated dimensions, that is to say in the case of rows or in the case of columns. The minimum number of memory cells for which the invention can sensibly be used is thus two. A greater number of memory cells is, of course, desirable and is generally also available in practice.

The current flowing through the cell that is to be read can essentially be described as:

$$I = U_1 - U^* - U_D / R_z;$$

where $U_1$ is the voltage of the first read voltage source, $U^*$ is the voltage at the first pole of the control circuit, $U_D$ is the voltage drop across the diode, and $R_z$ is the cell resistance, which is dependent on the magnetization. This current corresponds to the current that flows from the second pole of the control circuit to the assessment device, or to the assessment device line. This current flow can be determined by the assessment device, from which it is possible to deduce the state of the cell that is to be assessed.

A terminating resistor R, for example, can be used to convert the current to a voltage that can be assessed, in which case:

$$U_B = I^* R;$$

and $U_B$ is the voltage across the terminating resistor R on the assessment device line.

Internal resistances of the conductors that are used are ignored for these analyses.

Accordingly, one input of the assessment device can be connected or connectable via an assessment device line to the second pole of the control circuit; in this case, a first linear or non-linear terminating resistor can branch off from the assessment device line.

The assessment device thus may be a voltage assessment device, and the voltage that is assessed by it may be dependent on, for example proportional to, the current flowing through the second pole of the control circuit.

The assessment device part of the preferred circuit according to the invention may thus, in this embodiment, be regarded as a current/voltage converter.

Various possibilities are available to those skilled in the art in order to provide the control circuit. By using the control circuit, the behavior according to the invention and as described above of this control circuit can be achieved.

It is thus possible to construct the control circuit by using an operational amplifier and a transistor. In this case, the control circuit may have one operational amplifier with two inputs, whose noninverting input is connected as the third pole of the control circuit to the reference voltage source, and whose inverting input can be connected as the first pole of the control circuit individually to the first ends of the bit lines, with the operational amplifier having an output that is connected to the gate region of a transistor with two source/drain regions, one of whose source/drain regions is connected to the inverted input of the operational amplifier, and whose other source/drain region is connected as the second pole of the control circuit to the assessment device. In this case, the voltage that is present at the first pole of the control circuit is the same as the voltage that is present at the third pole.

The source region of the transistor that is used is in this case generally connected to the first pole of the control circuit. The operational amplifier in a control circuit such as this ensures by virtue of its construction that the voltage at the first pole always corresponds to that at the third pole, such that the fundamental conditions of the control circuit for the present invention can be ensured in a suitable manner by using an operational amplifier.

In order to simplify the memory circuit according to the invention, it may also be preferred to provide for the first voltage source to be identical to the third voltage source, that is to say to be combined with it, and in addition for the reference voltage source and the fourth voltage source to be combined if the control circuit is formed by using an operational amplifier. This makes it possible to achieve a particularly good match between the voltages.

As an alternative to this embodiment, the decoupling of the voltage on the cells and the voltage on the assessment device circuit, and the constancy of the voltage on the cells, can be achieved independently of the cell current through a control circuit, which has a bipolar transistor whose base is connected, as a third pole of the control circuit, to the reference voltage source, whose emitter can be connected, as a first pole of the control circuit, individually to the first ends of the bit lines, and whose collector is connected as the second pole of the control circuit to the assessment device line. These measures also allow the voltage within the cell region to be kept at a predetermined value, which is defined by the reference voltage source. However, in this case, the voltage at the emitter is offset with respect to the reference voltage by the magnitude of the base-emitter diode response voltage, that is, in contrast to the situation in which the control circuit has an operational amplifier and an MOS transistor, the values of the fourth voltage source and of the reference voltage source need not in this case be chosen to be approximately the same as one another, but, instead of this, the value of the reference voltage source must be adapted in such a way that approximately the same value as that of the fourth voltage source is present at the emitter.

The expression terminating resistor is used to describe a resistor to one of whose poles the current to be assessed is fed and whose other pole is connected to a further reference voltage. This reference voltage is generally GND, but it may also be some other potential, for example even one that is higher than that of the read voltage source. In this case, the circuit must be appropriately adapted, which is a measure with which those skilled in the art will be familiar.

For the purposes of the present invention, the expression approximately the same voltage in this case means that the discrepancy between the voltages, that is between the first and third or reference and fourth voltage, must be less than the response voltage of the diode, in order to prevent any undesirable current path through memory cells that are not intended to be read. This requirement for the accuracy of the match between the values of the voltage must also be extended to the entire cell array, in whose individual cells small leakage currents can likewise occur, which are additive over the entire array. The condition that results from this for the match between the first and third or fourth and reference voltage is dependent on the total size and configuration of the cell array, but in general represents a more strict criterion than that already mentioned. However, it can be satisfied well by suitable circuitry measures (by physically combining U1 and U3 or U4 and U5 (which is worthwhile only for appropriate embodiments, for example an operational amplifier), that is to say not providing them separately).

In this case, the reference voltage may be less than the first voltage. However, the first voltage may also be less than the reference voltage. In this case, appropriate modifications must be carried out to the rest of the circuit according to the invention. For example, it may be necessary to invert the transistors rather than providing poles that are connected to GND with an operating voltage, that is to say replacing a pMOS transistor by an nMOS transistor, with the bias direction of the diodes in the cell array being reversed.

The voltage difference between the first voltage and the voltage at the first pole of the control circuit should be constructed such that it is sufficient to achieve a sufficient current flow through the memory cell that is to be read, for a given resistance in the memory cell which is to be read and response voltage of the diode function.

The diodes of the magnetoresistive memory cells are preferably oriented such that a current can flow through the memory cell that is to be read when the voltages are applied. Depending on the choice of the voltages, this means that it may be necessary to reverse the orientation of the diodes.

In order to improve the time response of the circuit, it may also be preferred to provide for the read distributor also to be connected, or have to have the capability to be connected, to a precharging source (a second voltage source, U2). The voltage of the precharging source is preferably essentially the same as the voltage that is present at the first pole of the control circuit, or the voltage of the fourth voltage source, which is produced via the control circuit as a function of the value of the voltage U5 (that is to say, in the case of an OP circuit, U2=U5). This embodiment has been found to be advantageous in conjunction with embodiments of the invention that are outlined below, in which capacitors within the cell array must be charged or have their charges reversed, namely in particular the parasitic capacitance of the selected bit line. In this case as well, the precharging source and the fourth voltage source may be combined to form a single voltage source.

In principle, it would be feasible to dispense with the precharging by the precharging source U2. In this case, the charging or charge reversal of the capacitors would have to be carried out by using the cell resistance within the cell array. However, the time required to do this is in the region of microseconds, and is thus too long for many applications.

The magnetoresistive memory preferably can be configured such that the assessment device line has two assessment device paths that can be connected individually by using switching elements to the second pole of the control circuit; with a terminating resistor branching off from the respective assessment device paths; and in which case each of the two respective assessment device paths can be connected by using a respective switching element to one input of the voltage assessment device and to a respective capacitor in parallel with it.

This preferred configuration of the elements effectively results in two assessment device paths instead of the one assessment device path as outlined above. This means that it is possible to carry out two mutually independent assessments of the resistance produced by the memory cell that is to be read.

In this case, the two terminating resistors may have an identical resistance value, or their resistance values may differ. The two capacitors that are provided are used to store temporarily the voltages that occur during and after the measurement, so that it is possible to compare the two voltages in an appropriate voltage assessment device with two inputs. The configuration of two mutually independent assessment device paths also makes it possible, for example, to carry out the double assessment of a memory cell and an averaging process, from which the resistance value, and hence the binary content of the memory cell, can be determined with greater accuracy.

However, it is also possible to carry out a switching attempt between the two assessments in order to make it possible to deduce the previous binary state of the memory cell from any change that may have resulted in the resistance value of the memory cell that is to be read. In order to make it possible to carry out such a switching attempt, the magnetoresistive memory according to the invention preferably also has: a first write current source that can be connected individually to the first ends of the word lines by using switching elements, and a second write current source, which can be connected individually to the first ends of the bit lines by using switching elements. Such a switching attempt can be carried out in a specific direction by using the currents that are provided via the write current sources through the respectively selected word line and bit line in conjunction with the application of voltages, which are provided by the third and fourth voltage sources, to the memory cell which is to be read.

As described, the voltage sources and write current sources must be capable of being connected individually to the respectively used ends of the word lines and bit lines. Distributors are provided for this purpose, which pass the incoming and outgoing signals and voltages to the various word lines and bit lines. The distributors are thus branched conductor track systems, at whose ends the switching elements for connection to the word lines and bit lines are advantageously configured. Accordingly, the bit lines can be connected to the control circuit by using a read distributor with a switching element for each of the bit lines. The bit lines likewise can be connected to the second write current source by using the read distributor, in which case the second write current source and the control circuit can be connected by using switching elements to the read distributor.

The bit line likewise can be connected to the precharging source by using the read distributor, in which case the precharging source and the control circuit can be connected by using switching elements to the read distributor.

The switching elements for connection of the second write current source, of the control circuit and of the precharging source to the assessment device distributor are used to make it possible to produce the contacts in an alternative manner, since, for example, there is no point in allowing a direct electrical connection between the control circuit and the write current source.

The third and fourth voltage sources can be connected to the bit lines and word lines by using voltage distributors with a switching element for each bit line and word line.

The read voltage source likewise may be connected to the word lines by using a read voltage distributor, likewise with a switching element for each word line.

Finally, the first write current source likewise may be connected to the word lines by the read voltage distributor, in which case the first write current source and the first read voltage source can be connected to the read voltage distributor in a similar way to that in which the second write current source and the control circuit can be connected to the read voltage distributor, by using switching elements.

The switching elements mentioned above are preferably at least partially, although preferably in their entirety, in the form of transistors.

The magnetoresistive memory cells that are used are preferably so-called vertical current memory cells (current perpendicular to plane). In these cells, the elements of the memory cells, namely the bit line, first magnetic element, tunnel dielectric, second magnetic element and word line, are disposed vertically one above the other, with respect to one surface in an integrated circuit or its silicon structures. During the assessment process, the current thus flows from top to bottom or from bottom to top.

With the objects of the invention in view, there is also provided a method for reading a magnetoresistive memory. Everything that has been stated above with regard to the apparatus applies to the method, and reference is made to the entire contents of this description.

The invention is based on a method for reading memory cells in a magnetoresistive memory having a configuration of magnetoresistive memory cells that are disposed in two or more rows and/or two or more columns; a bit line for each of the columns that is connected to first poles of the memory cells which belong to that column; a word line for each of the rows, which is connected to second poles of the memory cells which belong to that row; and a reference voltage source with a reference voltage that is connected to the third pole of a control circuit, whose first pole is connected to the first pole of the memory cell which is to be read, with the control circuit producing a voltage which is present at the first pole and is related by a defined function to the reference voltage at the third pole of the control circuit (1) (which, for example, is the same as the reference voltage); with the method having the following steps:

A: application of a first read voltage source with a first voltage to the second pole of a memory cell that is to be read;

B: application of a third voltage source with a voltage which is approximately the same as the first voltage to those bit lines that are not connected to the memory cell that is to be read;

C: application of a fourth voltage source with a voltage that is approximately the same as the voltage that is present at the first pole of the control circuit to those word lines that are not connected to the memory cell that is to be read;

D: assessment of the current flowing through a second pole of the control circuit and the memory cell (3a) which is to be read, or assessment of a variable that is derived from this by an assessment device to which current is fed from the second pole of the control circuit (1).

One possible derived variable may, for example, be the voltage. The derived variable may therefore be a voltage that is dropped across a first terminating resistor and may be assessed by a voltage assessment device that is connected in parallel with the first terminating resistor, with the voltage being proportional to the current that is flowing through the memory cell that is to be read.

While the voltage assessment device is carrying out a measurement of the applied voltage in order to make it possible to deduce the resistance value of the memory cell that is to be read via the current flow, voltages are present on the word lines and bit lines that are not being addressed and, in conjunction with the diodes in the memory cells, these prevent inadvertent currents from occurring. Overall, this configuration makes it possible to significantly improve the stability of the reading process, and its accuracy, and to considerably reduce the power loss in the entire system.

The successive description of the method steps according to the invention does not include any time sequence. While the steps may be carried out successively, it is, however, first of all necessary to ensure that all the conditions to be satisfied by the steps A, B, and C for reliable assessment are met by the voltage assessment device before a reliable measurement is possible. For both practicality and speed reasons, it is thus preferable for the steps A to C to be carried out essentially at the same time. Step D can also be carried out essentially at the same time, or as quickly as possible after the other steps.

The method according to the invention may also include the production of a precharge on the lines that are connected to the memory cells, since they have relatively large parasitic capacitances. This measure can improve the response of the memory and thus, in particular, reduce the access time, and can be characterized by the following additional steps: before step D, C, or B:

A2: application of a precharging source, whose voltage is essentially the same as the voltage which is present at the first pole of the control circuit, to the bit line which is connected to the first pole of the memory cell which is to be read; and after step A2 and before step D, C or B:

A3: disconnection of the precharging source from the bit line which is connected to the first pole of the memory cell that is to be read.

As already described above, the method according to the invention can be further refined in order to improve the accuracy with which the value of the memory cells which are to be read is determined. For example, it is possible to carry out two mutually independent reading processes, in which the voltages that are in each case present are temporarily stored in two capacitors, which are connected in parallel to inputs of the voltage assessment device. The voltage values that are temporarily stored in this way then finally can be assessed together in the voltage assessment device. However, it is also possible for the method to be improved by the two reading processes being carried out successively, with a switching attempt being made in between. This has the advantage that the measurement of the voltages need not be as accurate, since more importance is to be placed on the differences that may possibly occur between the resultant voltages before and after the switching attempt. The method thus includes a first reading process, followed by a switching attempt, which is once again followed by a second reading process for the voltage value. One preferred embodiment of this multistep method includes the following further steps:

E: storage of the voltage that is dropped across the first terminating resistor in a first capacitor that is connected in parallel with the voltage assessment device;

F: disconnection of the first capacitor from the first terminating resistor and from the second pole of the control circuit;

G: disconnection of the first read voltage source from the memory cell that is to be read;

H: disconnection of the control circuit from the memory cell that is to be read;

I: application of the voltage that is present at the fourth voltage source to all the word lines;

J: application of the voltage that is present at the third voltage source to all the bit lines;
K: application of a first current source to the word line that is connected to the second pole of the memory cell that is to be read;
L: application of a second current source to the bit line that is connected to the second pole of the memory cell that is to be read;
M: disconnection of the first current source from the word line that is connected to the second pole of the memory cell that is to be read;
N: disconnection of the second current source from the bit line that is connected to the first pole of the memory cell that is to be read;
O: application of the first read voltage source to the second pole of the memory cell that is to be read;
P: connection of the first pole of the control circuit to the memory cell that is to be read;
Q: application of the third voltage source to those bit lines that are not connected to the memory cell that is to be read;
R: application of the fourth voltage source to those word lines that are not connected to the memory cell that is to be read;
S: connection of the second pole of the control circuit to a second terminating resistor; a second capacitor that is connected in parallel with the second terminating resistor; and a second input, which is connected in parallel with it, of the voltage assessment device;
T: storage of the voltage that is dropped across the second terminating resistor in the second capacitor;
U: disconnection of the second capacitor from the second terminating resistor and from the second pole of the control circuit; and
V: comparison of the voltage that is stored in the first capacitor and in the second capacitor in the voltage assessment device.

It should be noted here that the embodiment of the method according to the invention as described above has been described with respect to the use of a voltage assessment device and the detection of the voltage as the variable that is derived from the current, since the temporary storage that is required here for the two measurements can be carried out in a simple manner. Furthermore, step U is necessary only if further processes could take place in the cell array or in the entire circuit between the storage and assessment processes, which would lead to the second capacitor being emptied. The steps described above for the method according to the invention lead to a clear improvement in the assessment quality. Once again, despite the various steps being listed one after the other, the steps do not all need to be carried out successively. In fact, it is also possible to carry out some of the steps at the same time, or essentially at the same time. For example, it is preferable for the steps A to D and E to be carried out essentially at the same time. It is likewise preferable for the steps F, G, and H to be carried out essentially at the same time, in which case these steps should be carried out after the first reading process and thus after the steps A to E, as steps which are used for the transition to the write attempt. It is also preferable for the steps I to L to be carried out essentially at the same time, although these should be carried out after the disconnection steps F, G, and H. Furthermore, the steps M and N can be carried out essentially at the same time, although these should also once again be carried out after the steps A to L. Finally, it is also possible to carry out the steps O to T essentially at the same time. These include the subsequent, second reading process.

The method according to the invention also can be characterized in that the reference voltage is less than the first voltage, although the opposite situation may also be considered, as already described above with reference to the disclosure of the memory according to the invention. In this case as well, the voltage difference should be sufficient to achieve a sufficient current flow through the memory cell that is to be read, for a given resistance in the memory cell that is to be read and response voltage of the diode function.

Other features that are considered as characteristic for the invention are set forth in the appended claims.

Although the invention is illustrated and described herein as embodied in a magnetoresistive memory and a method for reading a magnetoresistive memory, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

As described above, it is possible to carry out the invention using a simple assessment device with one input and a simple assessment method. The duplicated reading method described in more detail in the following text allows a more reliable assessment despite the expected large local cell resistance variations.

In detail, these steps are as follows:
A. reading of the cell state and storage of the information,
B. subsequent switching attempt in a specific direction,
C. further reading of the cell state and storage of the information, and
D. comparison of the results and assessment.

Figure 1:
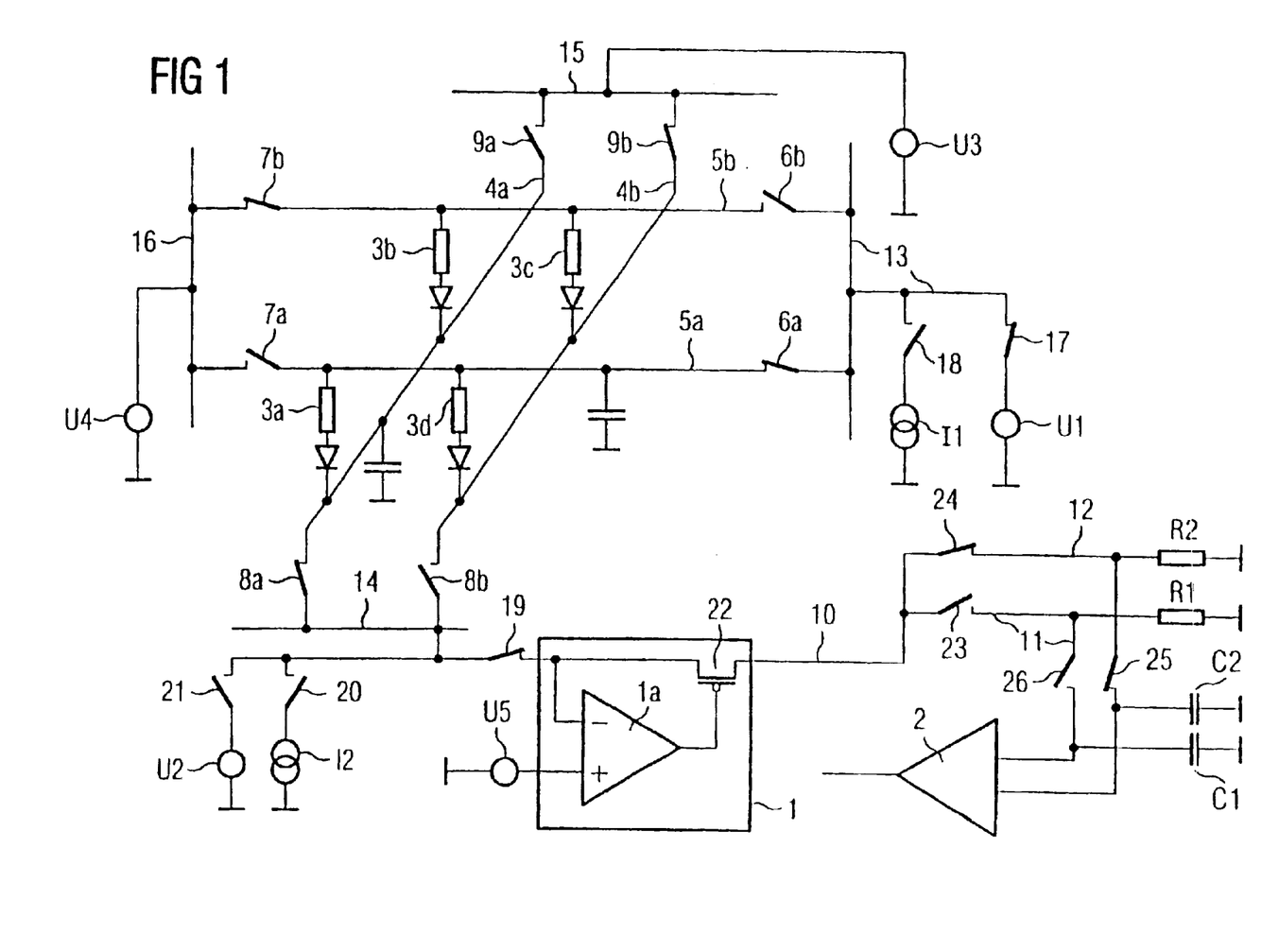
FIG. 1 is a circuit diagram showing a first embodiment of a magnetoresistive memory according to the invention during the reading process.

Referring now to the figures of the drawings in detail and first, particularly to FIG. 1 thereof, there is shown one embodiment of a circuit for the magnetoresistive memory according to the invention. A matrix is provided, including m word lines 5a, 5b and n bit lines 4a, 4b, in which the selected word lines 5a are connected by a first read voltage source U1 via a read voltage distributor 13 and a switching element 6a to a predetermined potential, for example 2 volts. The bit line 4a that belongs to the memory cell 3a that is to be read is preferably drawn to a second voltage, for example 1 volt, by briefly connecting the voltage source U2 by using the switching elements 8a and 21. The control circuit 1 which, in the present exemplary embodiment, includes an operational amplifier 1a and a transistor, for example a pMOS series transistor 22, keeps the memory cell 3a which is to be read at this voltage level irrespective of the cell current, since a voltage source U5 is applied to a further input of the operational amplifier 1a and supplies a voltage which is as identical as possible to U2. While the source region of the transistor 22 keeps the bit line voltage at a constant value of, in the present case, one volt (1 V), the drain: region is at a variable voltage that is dependent on the resistance of the memory cell that is to be read, because the resistance (which depends on the magnetization state) of the memory cell 3a that is to be read defines the current through this memory cell, and which also flows through the transistor 22 and the resistor R1 or R2, respectively, to the assessment device circuit. This current therefore causes a voltage drop that is dependent on the cell resistance across the terminating resistor R1, R2 of the assessment device circuit, with this voltage in this case being identical to the drain voltage of the transistor 22.

This voltage can be either assessed immediately in the voltage assessment device 2, or can be temporarily stored by the capacitors C1 and C2 that are illustrated in FIG. 1, with the capacitor C1 sensibly being assessed first for a multiple reading process.

Word lines 5b, which are not addressed, are kept at a voltage that essentially corresponds to the second voltage, that is to say by way of example one volt (1 V), as is provided by the second voltage source U2, by using the switching element 7b via the fourth voltage source U4 and a voltage distributor 16. Bit lines 4b which are not addressed are kept at a voltage level essentially the same as the first voltage, for example two volts (2 V), by using a third voltage source U3 via a second voltage distributor 15 and switching elements 9b. As can be seen, all the bit lines and word lines are thus at fixed levels. This concept is thus physically simple, and thus provides the functionality.

If, according to the invention, only one assessment process is intended to be carried out, the first capacitor C1 is not required for temporary storage of the voltage. In this case, the current, the voltage or any other derived variable can be determined immediately by using an assessment device 2, which is connected to the assessment device line 10 and is otherwise connected in parallel with the first capacitor C1 (that is to say the two are at the same potentials).

A writing process, for example for a switching attempt, is carried out by first of all applying the voltage sources U3 and U4 to all the word lines and bit lines. The current is applied via the current sources I1 and I2 by connecting the current sources by using the switching elements 18 and 20 while, at this time, not only is the assessment device complex disconnected from the memory cell configuration by using the switching element 19, but the first read voltage source U1 is also disconnected from it by using the switching element 17, and the voltage source U2 is disconnected from it by using the switching element 21. The current levels of the current sources I1 and I2 are, for example, each about 1 mA. The currents are applied from the write current sources I1 and I2 to the word line 5a and to the bit line 4a, and are drawn from the voltage sources U3 and U4.

Figure 2:
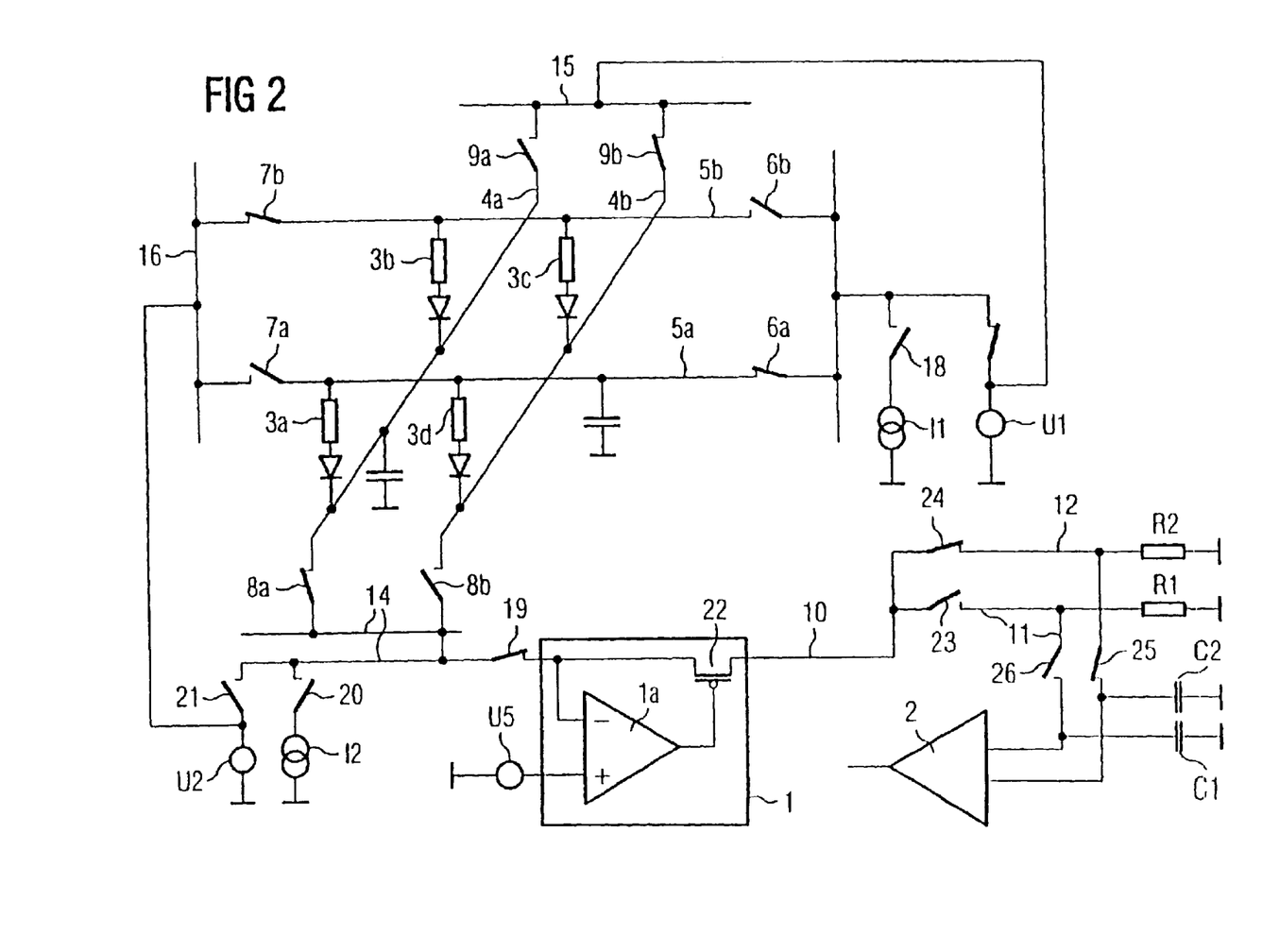
FIG. 2 is a circuit diagram showing a second embodiment of the magnetoresistive memory according to the invention, with the voltage sources being combined.

FIG. 2 shows a further embodiment of the present invention, in which the voltage sources U1 and U3, as well as U2 and U4, whose voltages are in each case approximately the same, are combined to form common voltage sources U1 and U2. Otherwise, the circuit that is shown in FIG. 2 and its method of operation correspond to the above exemplary embodiment, as is illustrated in FIG. 1. The voltage source U5 can also be integrated in this way, that is to say it may be omitted in the present exemplary embodiment if the third pole of the control circuit is connected directly to the precharging source U2.

We claim:

1. A magnetoresistive memory, comprising:
 a configuration of magnetoresistive memory cells each having respective first and second poles and a resistor and a diode function, said magnetoresistive memory cells being configured in a plurality of rows and a plurality of columns;
 a respective bit line for each of said columns connected to said first poles of said memory cells belonging to a respective one of said columns and having first and second ends;
 a word line for each of said rows connected to said second poles of said memory cells belonging to a respective one of said rows, said word line having first and second ends;
 a first read voltage source having a first voltage;
 switching elements connecting said first read voltage source individually to said first ends of said word lines;
 a control circuit, having:
  a first pole;
  a read distributor;
  switching elements connecting individually said first pole via said read distributor to said first ends of the bit lines;
  an assessment device;
  a second pole for feeding current to said assessment device; and
  a third pole connected to a reference voltage source;
  a third voltage source having a voltage approximately equaling the first voltage from said first read voltage source;
  switching elements individually connecting said third voltage source to said second ends of said bit lines;
  a fourth voltage source; and
  switching elements connecting individually said fourth voltage source to said second ends of said word lines;
 the voltage of said reference voltage source and said control circuit being constructed such that a voltage at said first pole corresponds approximately to a voltage from said fourth voltage source; and a current flowing through said second pole of said control circuit approximately equals a current flowing through said first pole of said control circuit, and the current through said second pole is independent of the voltage present at said second pole of the control circuit.

2. The magnetoresistive memory according to claim 1, wherein:
 said assessment device has an input; and
 an assessment device line connects said input to said second pole of said control circuit; and
 a terminating resistor branches from said assessment device line.

3. The magnetoresistive memory according to claim 2, wherein said terminating resistor is linear.

4. The magnetoresistive memory according to claim 2, wherein said terminating resistor is non-linear.

5. The magnetoresistive memory according to claim 2, wherein:
 said assessment device line has two assessment device paths;
 switching elements connect individually said assessment device paths to said second pole of said control circuit;
 a terminating resistor branches from each of said respective assessment device paths;
 said voltage assessment device has an input;
 a capacitor is connected parallel to said voltage assessment device; and
 a respective switching element connects each of said two respective assessment device paths to said input of said voltage assessment device and to said respective capacitor.

6. The magnetoresistive memory according to claim 1, wherein said assessment device is a voltage assessment device.

7. The magnetoresistive memory according to claim 6, wherein said voltage assessment device assesses a voltage, the voltage depending on the current flowing through said second pole of said control circuit.

8. The magnetoresistive memory according to claim 1, wherein said control circuit has an operational amplifier with a noninverted and an inverted input, said noninverted input being connected as said third pole to said reference voltage source, and said inverted input being connected as said first pole individually to said first ends of said bit lines;

a transistor with a gate region and two source/drain regions, a first of said source/drain regions being connected to said inverted input of said operational amplifier, and a second of said source/drain regions, as said second pole, feeds current to said assessment device, the voltage present at said first pole equaling as the voltage present at the third pole; and said operational amplifier has an output connected to said gate of said transistor.

9. The magnetoresistive memory according to claim 1, wherein said reference voltage source is simultaneously said fourth voltage source.

10. The magnetoresistive memory according to claim 1, wherein said control circuit has a bipolar transistor with a base connected to said reference voltage source as a third pole of said control circuit, an emitter connected individually to said first ends of said bit lines as a first pole of said control circuit, and a collector feeds current to said assessment device as a second pole of said control circuit.

11. The magnetoresistive memory according to claim 1, wherein said first voltage source is simultaneously said third voltage source.

12. The magnetoresistive memory according to claim 1, wherein the reference voltage is less than the first voltage.

13. The magnetoresistive memory according to claim 1, wherein a voltage difference is sufficient to achieve a sufficient current flow through a given one of the memory cells to be read, whose resistor has a given resistance whose diode function has a given response voltage.

14. The magnetoresistive memory according to claim 1, wherein said diode functions of said magnetoresistive memory cells are oriented to allow a current to flow through a given one of said memory cells to be read when the first voltage and the reference voltage are applied.

15. The magnetoresistive memory according to claim 1, further comprising a precharging source connected to said read distributor.

16. The magnetoresistive memory according to claim 15, wherein said precharging source has a voltage essentially equaling the voltage present at said first pole of said control circuit.

17. The magnetoresistive memory according to claim 15, wherein said precharging source is simultaneously said fourth voltage source.

18. The magnetoresistive memory according to claim 1, further comprising:
a first write current source;
first switching elements individually connecting said first write current source to said first ends of said word lines;
a second write current source; and
second switching elements individually connecting said second write current source to said first ends of said bit lines.

19. The magnetoresistive memory according to claim 18, further comprising:
a precharging source connected to said bit lines by said read distributor; and
switching elements connecting said precharging source and said control circuit to said read distributor.

20. The magnetoresistive memory according to claim 1, further comprising voltage distributors with a switching element for each of said bit lines and word lines and connecting said third and fourth voltage sources to said bit lines and word lines.

21. The magnetoresistive memory according to claim 1, further comprising a read voltage distributor with a switching element for each word line and connecting said first read voltage source to said word lines.

22. The magnetoresistive memory according to claim 21, wherein:
said read voltage distributor connects said first write current source to said word lines; and
switching elements connect said first write current source and said first read voltage source to said read voltage distributor.

23. A method for reading memory cells in a magnetoresistive memory, which comprises:
providing a configuration of magnetoresistive memory cells disposed in a plurality of rows and a plurality of columns, the memory cells each having a resistor and a diode function and first and second poles; a bit line for each of the columns connected to the first poles of the memory cells belonging to that column; a word line for each of the rows connected to the second poles of the memory cells belonging to that row; and a control circuit having first, second, and third poles, the first pole being connected to the first pole of a one of the memory cells to be read, a reference voltage source with a reference voltage connected to the third pole of the control circuit, the control circuit producing a voltage at the first pole related by a defined function to the reference voltage at the third pole of the control circuit;

A: connecting a first read voltage source with a first voltage differing from the reference voltage, to the second pole of the one of memory cells to be read;

B: connecting a third voltage source with a voltage approximately equaling the first voltage to bit lines not connected to the one of the memory cells to be read;

C: connecting a fourth voltage source with a voltage approximately equaling the voltage present at the first pole of the control circuit to word lines not connected to the one of the memory cells to be read; and D: assessing one of a current flowing through the second pole of the control circuit and the one of the memory cells to be read and a variable derived from a current from the second pole of the control circuit by an assessment device being fed the current.

24. The method according to claim 23, wherein the voltage present at the first pole of the control circuit equals the reference voltage at the third pole of the control circuit.

25. The method according to claim 24, which further comprises the following further steps:
E: storing the voltage dropped across the first terminating resistor in a first capacitor connected in parallel with the voltage assessment device;
F: disconnecting the first capacitor from the first terminating resistor and from the second pole of the control circuit;

G: disconnecting the first read voltage source from the one of the memory cells to be read;

H: disconnecting the control circuit from the one of the memory cells to be read;

I: applying the voltage present at the fourth voltage source to all of the word lines;

J: applying the voltage present at the third voltage source to all of the bit lines;

K: applying a first current source to the word line connected to the second pole of the one of the memory cells to be read;

L: applying a second current source to the bit line connected to the second pole of the one of the memory cells to be read;

M: disconnecting the first current source from the word line connected to the second pole of the memory cell to be read;

N: disconnecting the second current source from the bit line connected to the first pole of the one of the memory cells to be read;

O: applying the first read voltage source to the second pole of the one of the memory cells to be read;

P: connecting the first pole of the control circuit to the one of the memory cells to be read;

Q: applying the third voltage source to the bit lines not connected to the one of the memory cells to be read;

R: applying the fourth voltage source to the word lines not connected to the one of the memory cells to be read;

S: connecting the second pole of the control circuit to a second terminating resistor; connecting a second capacitor in parallel with the second terminating resistor; and connecting a second input of the voltage assessment device in parallel with the second capacitor;

T: storing the voltage dropped across the second terminating resistor in the second capacitor;

U: disconnecting the second capacitor from the second terminating resistor and from the second pole of the control circuit; and V: comparing the voltage stored in the first capacitor and in the second capacitor in the voltage assessment device.

26. The method according to claim 23, which further comprises:

creating the derived variable by dropping a voltage proportional to the current flowing through the one of the memory cells to be read across a first terminating resistor;

connecting a voltage assessment device in parallel with a first terminating resistor; and assessing the voltage with the voltage assessment device.

27. The method according to claim 23, which further comprises carrying out steps A to D essentially simultaneously.

28. The method according to claim 23, which further comprises the following steps:

before one of steps D, C, and B:

A2: applying a precharging source to the bit line connected to the first pole of the one of the memory cells to be read, the precharging source having a voltage essentially equaling the voltage present at the first pole of the control circuit; and after step A2 and before the at least one of step D, C, and B:

A3: disconnecting the precharging source from the bit line connected to the first pole of the one of the memory cells to be read.

29. The method according to claim 23, wherein the reference voltage is less than the first voltage.

30. The method according to claim 23, which further comprises providing a voltage difference sufficient to achieve a sufficient current flow through the one of the memory cells to be read to overcome a resistance of the resistor and a response voltage of the diode function of the one of the memory cells to be read.

* * * * *